(12) United States Patent
Shimoi et al.

(10) Patent No.: US 8,673,167 B2
(45) Date of Patent: Mar. 18, 2014

(54) LASER PROCESSING METHOD

(75) Inventors: Hideki Shimoi, Hamamatsu (JP);
Hiroyuki Kyushima, Hamamatsu (JP);
Keisuke Araki, Hamamatsu (JP)

(73) Assignee: Hamamatsu Photonics K.K.,
Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/361,079

(22) Filed: Jan. 30, 2012

(65) Prior Publication Data
US 2012/0125892 A1 May 24, 2012

Related U.S. Application Data

(63) Continuation-in-part of application No. PCT/JP2011/066319, filed on Jul. 19, 2011.

(30) Foreign Application Priority Data

Jul. 26, 2010 (JP) ................................. 2010-167434

(51) Int. Cl.
*B44C 1/22* (2006.01)
*C03C 15/00* (2006.01)
*C03C 25/68* (2006.01)
*C23F 1/00* (2006.01)

(52) U.S. Cl.
USPC .................................. 216/94; 216/83; 216/99

(58) Field of Classification Search
USPC ................................................ 216/65, 87, 94
See application file for complete search history.

(56) References Cited

U.S. PATENT DOCUMENTS

| 6,992,026 B2 | 1/2006 | Fukuyo et al. |
| 7,033,519 B2 | 4/2006 | Taylor et al. |
| 2005/0272223 A1 | 12/2005 | Fujii et al. |
| 2009/0065474 A1* | 3/2009 | Chida et al. ..................... 216/27 |
| 2010/0136766 A1 | 6/2010 | Sakamoto et al. |

FOREIGN PATENT DOCUMENTS

| JP | 4-150212 | 5/1992 |
| JP | 7-40482 | 5/1995 |
| JP | 10-202878 | 8/1998 |
| JP | 2873937 | 1/1999 |
| JP | 2002-210730 | 7/2002 |

(Continued)

OTHER PUBLICATIONS

Andrius Marcinkevicius, "Femtosecond laser-assisted three-dimensional microfabrication in silica," Optics Letters, Mar. 1, 2001, vol. 26, No. 5, pp. 277-279.

*Primary Examiner* — Roberts Culbert
(74) *Attorney, Agent, or Firm* — Drinker Biddle & Reath LLP

(57) ABSTRACT

A laser processing method for forming a hole in a sheet-like object to be processed made of silicon comprises a depression forming step of forming a depression in a part corresponding to the hole on a laser light entrance surface side of the object, the depression opening to the laser light entrance surface; a modified region forming step of forming a modified region along a part corresponding to the hole in the object by converging a laser light at the object after the depression forming step; and an etching step of anisotropically etching the object after the modified region forming step so as to advance the etching selectively along the modified region and form the hole in the object; wherein the modified region forming step exposes the modified region or a fracture extending from the modified region to an inner face of the depression.

11 Claims, 15 Drawing Sheets

(56) References Cited

FOREIGN PATENT DOCUMENTS

| | | |
|---|---|---|
| JP | 2004-128445 | 4/2004 |
| JP | 2004-136358 | 5/2004 |
| JP | 2004-160618 | 6/2004 |
| JP | 2004-223586 | 8/2004 |
| JP | 2004-304130 | 10/2004 |
| JP | 2004-351494 | 12/2004 |
| JP | 2004-359475 | 12/2004 |
| JP | 2005-1211 | 1/2005 |
| JP | 2005-74663 | 3/2005 |
| JP | 2005-121915 | 5/2005 |
| JP | 2005-121916 | 5/2005 |
| JP | 2005-144586 | 6/2005 |
| JP | 2005-144622 | 6/2005 |
| JP | 2005-152693 | 6/2005 |
| JP | 2005-169993 | 6/2005 |
| JP | 2005-206401 | 8/2005 |
| JP | 2005-208175 | 8/2005 |
| JP | 2005-306702 | 11/2005 |
| JP | 2005-351774 | 12/2005 |
| JP | 2006-167804 | 6/2006 |
| JP | 2006-176355 | 7/2006 |
| JP | 2006-290630 | 10/2006 |
| JP | 2006-352171 | 12/2006 |
| JP | 2007-36758 | 2/2007 |
| JP | 2007-101833 | 4/2007 |
| JP | 2010-155259 | 7/2010 |
| WO | 00/50198 | 8/2000 |
| WO | WO-2007058284 A1 | 5/2007 |

* cited by examiner

Fig.8
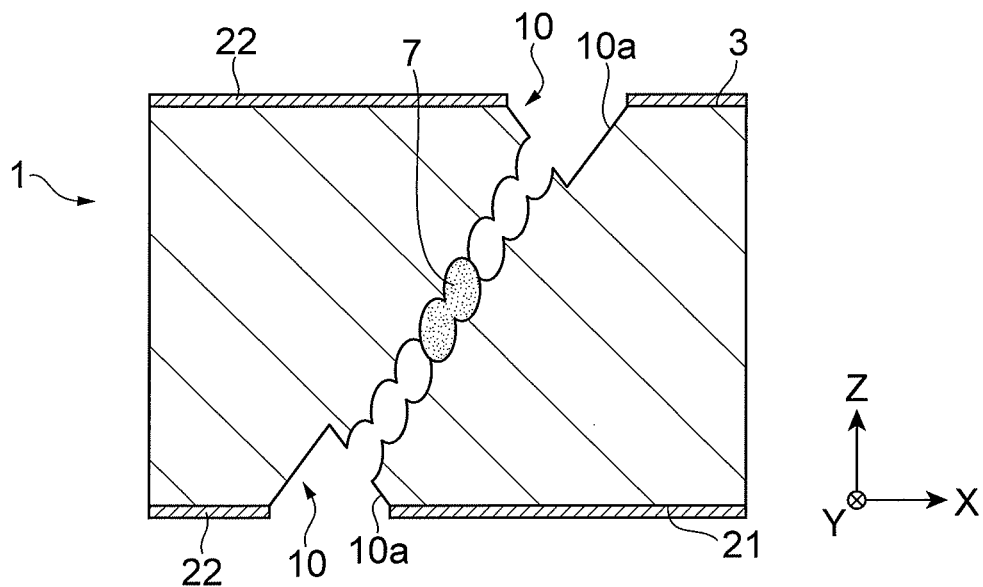
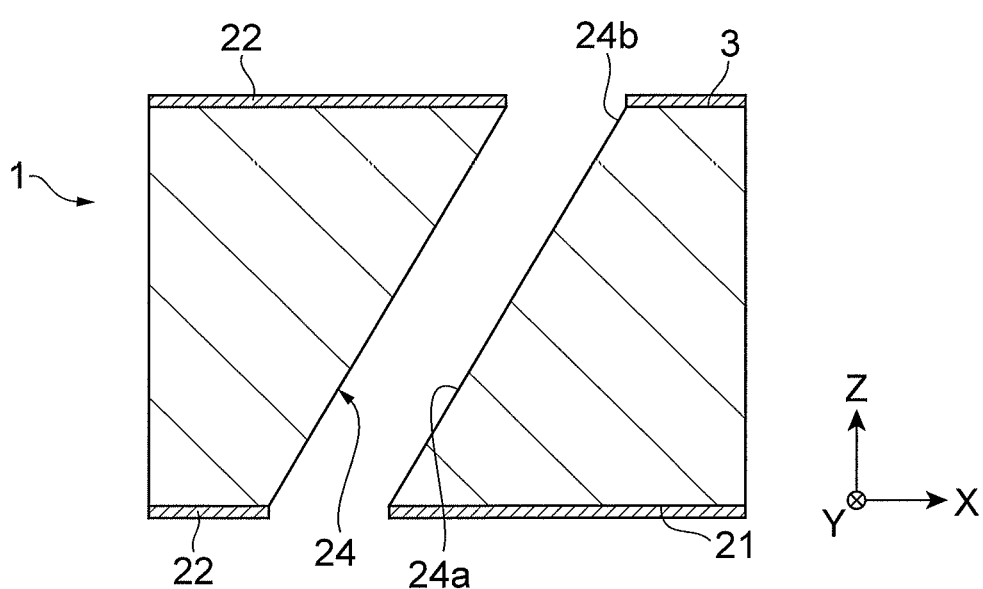

Fig.9
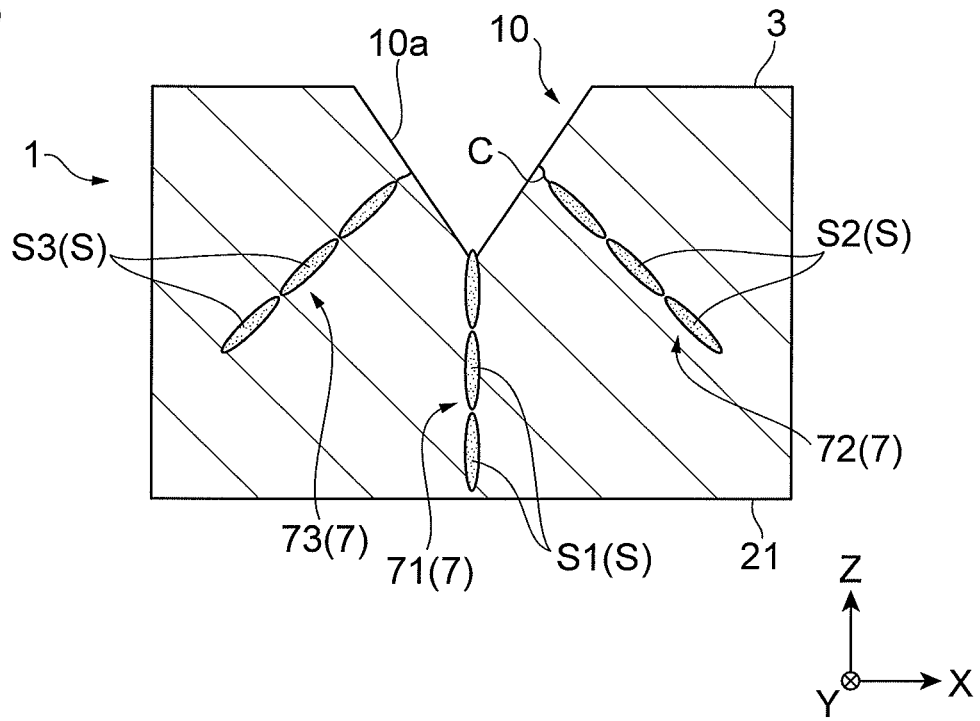
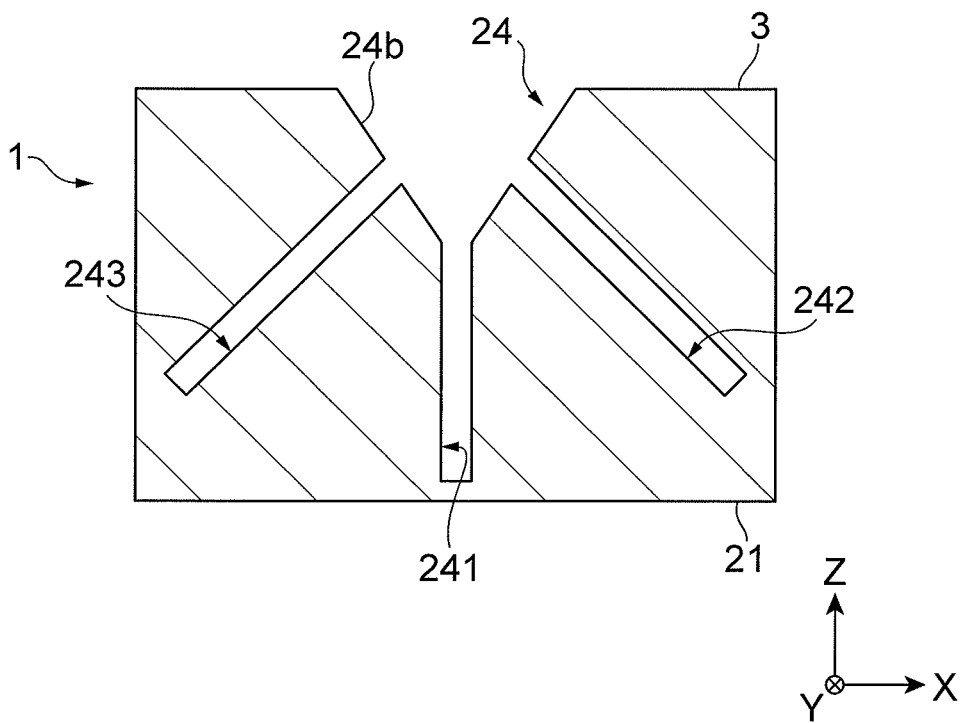

Fig.10
(a)
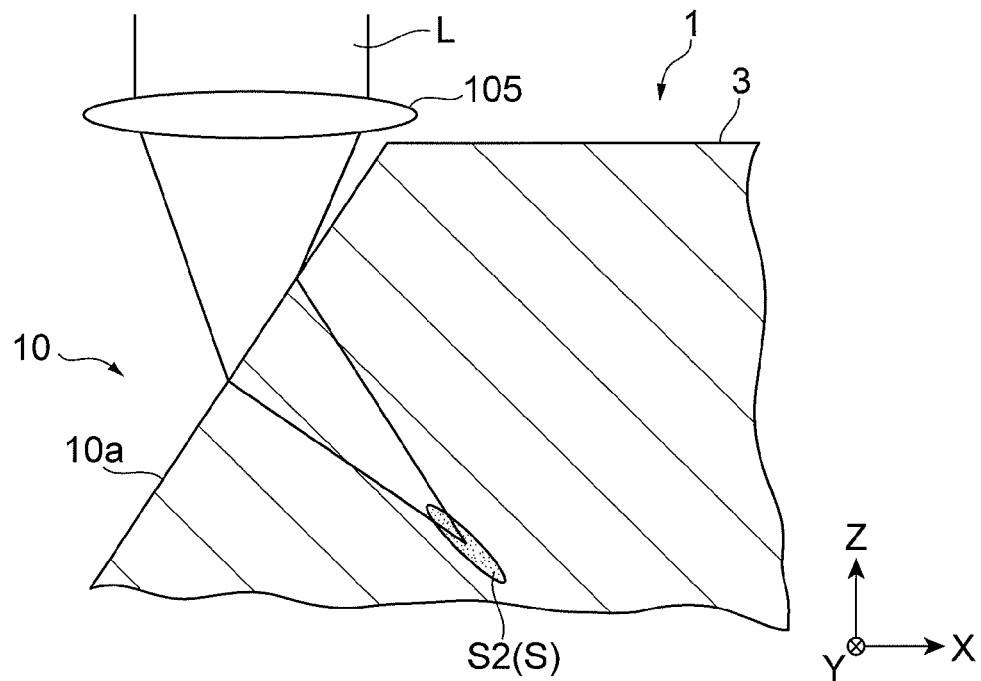
(b)
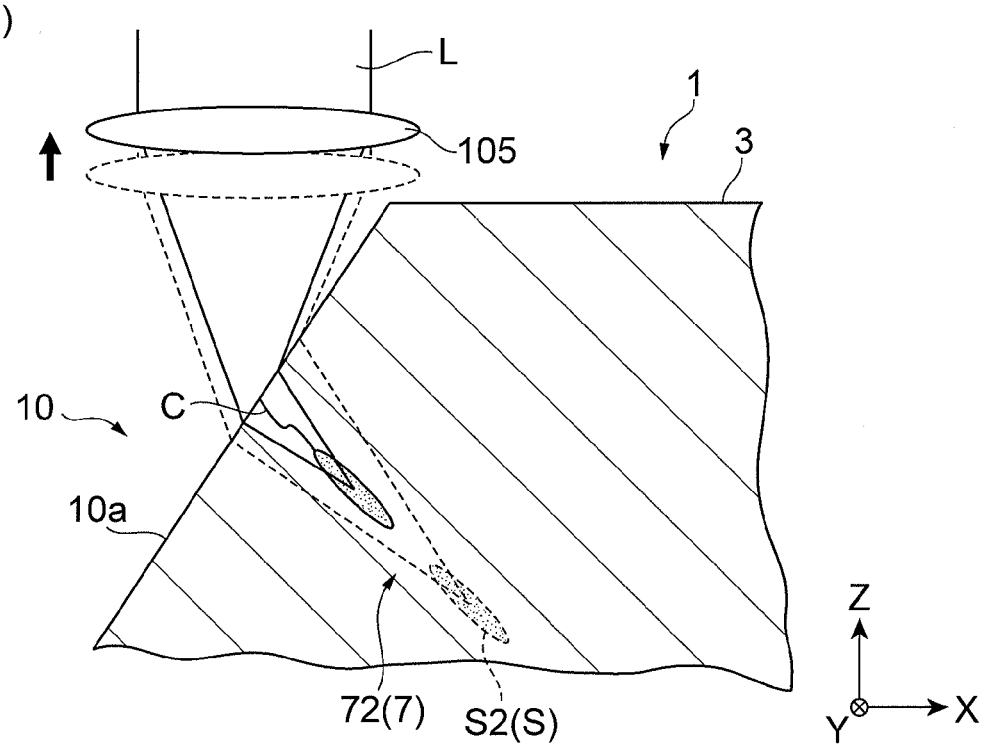

Fig.11
(a)
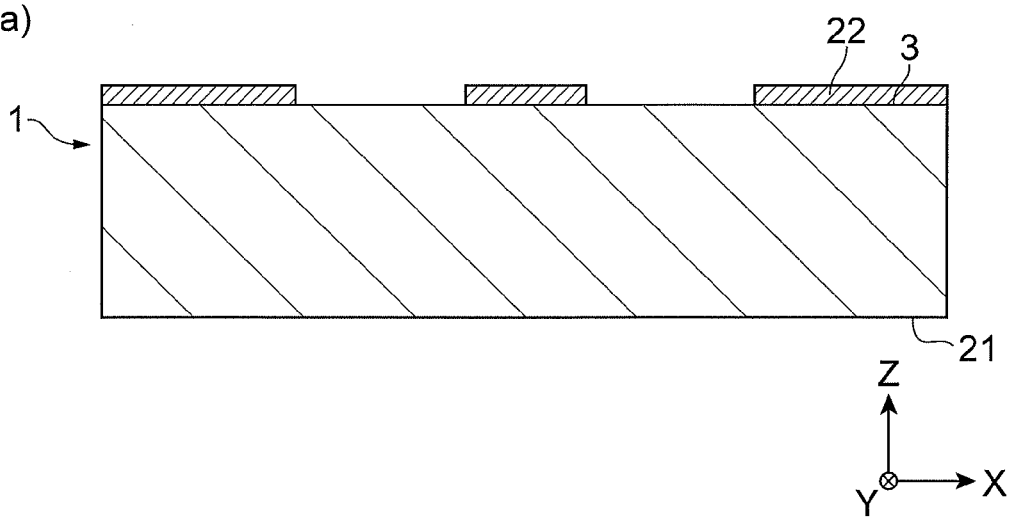
(b)
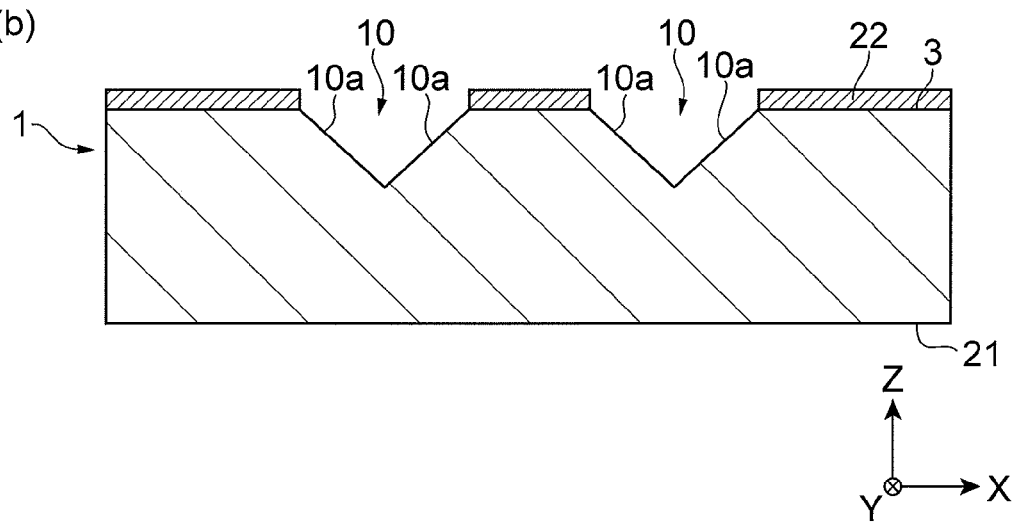
(c)
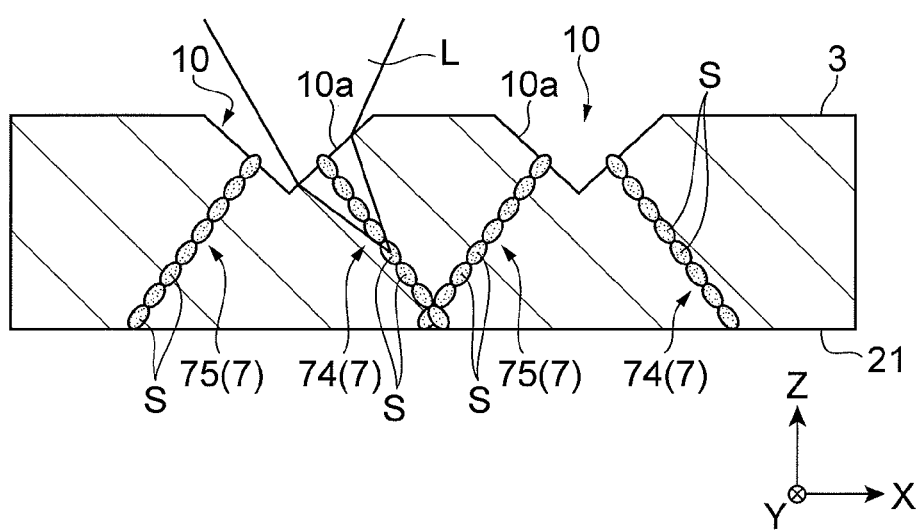

Fig.12
(a)
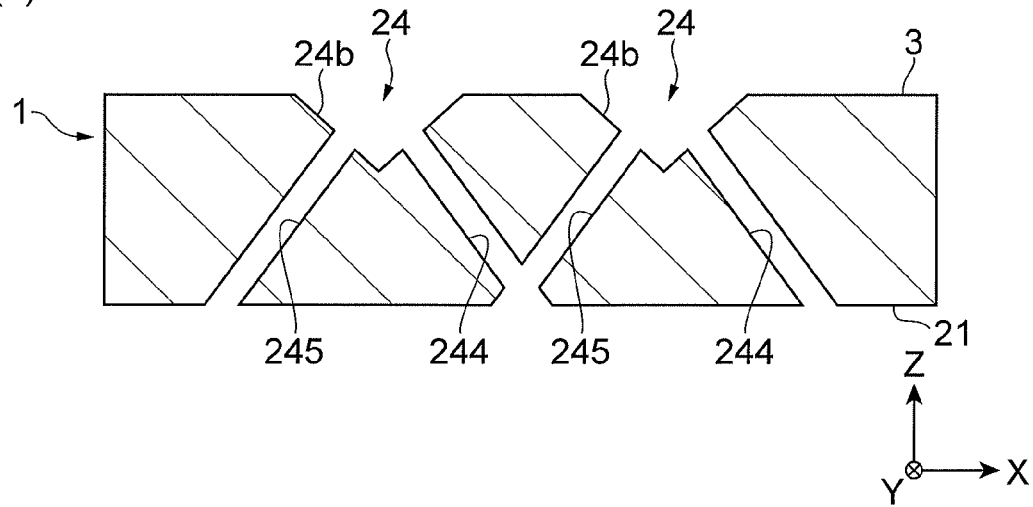
(b)
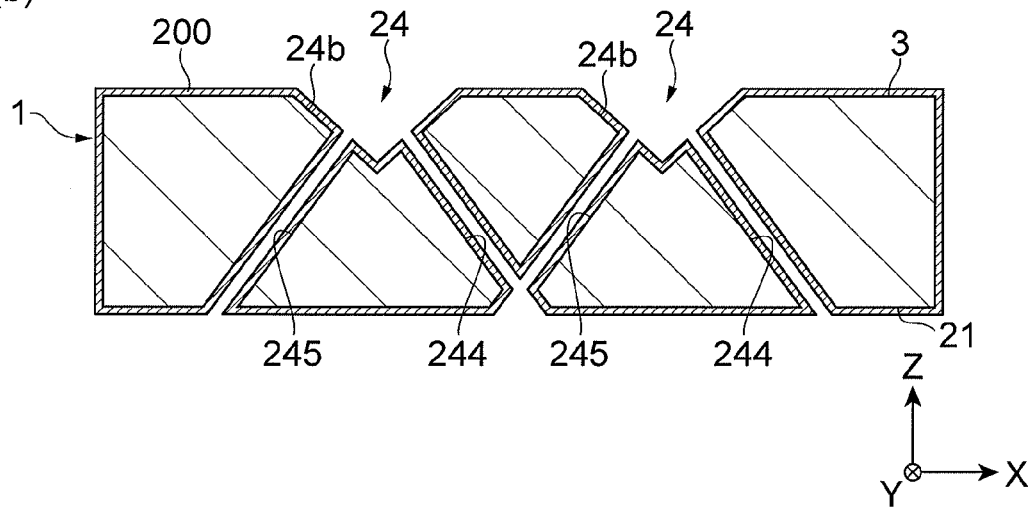
(c)
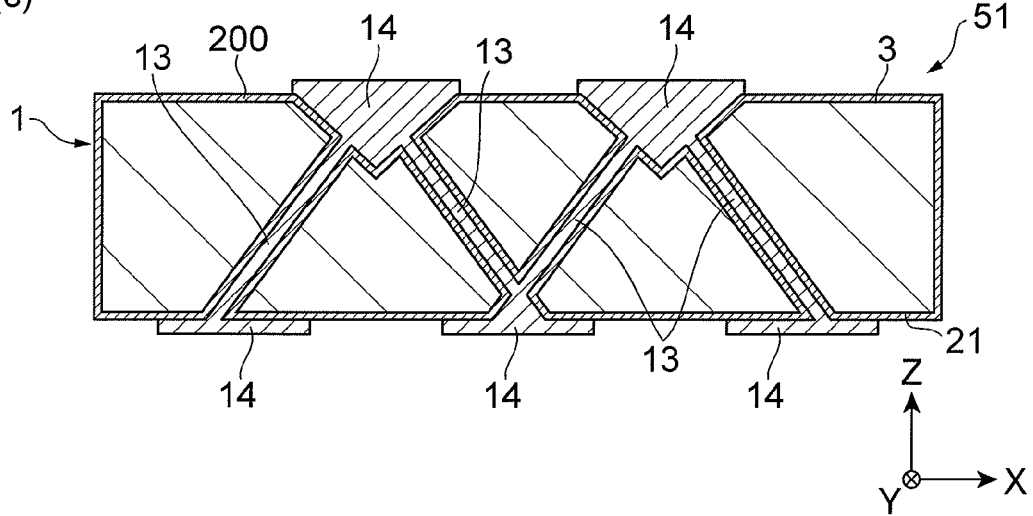

Fig.13
(a)
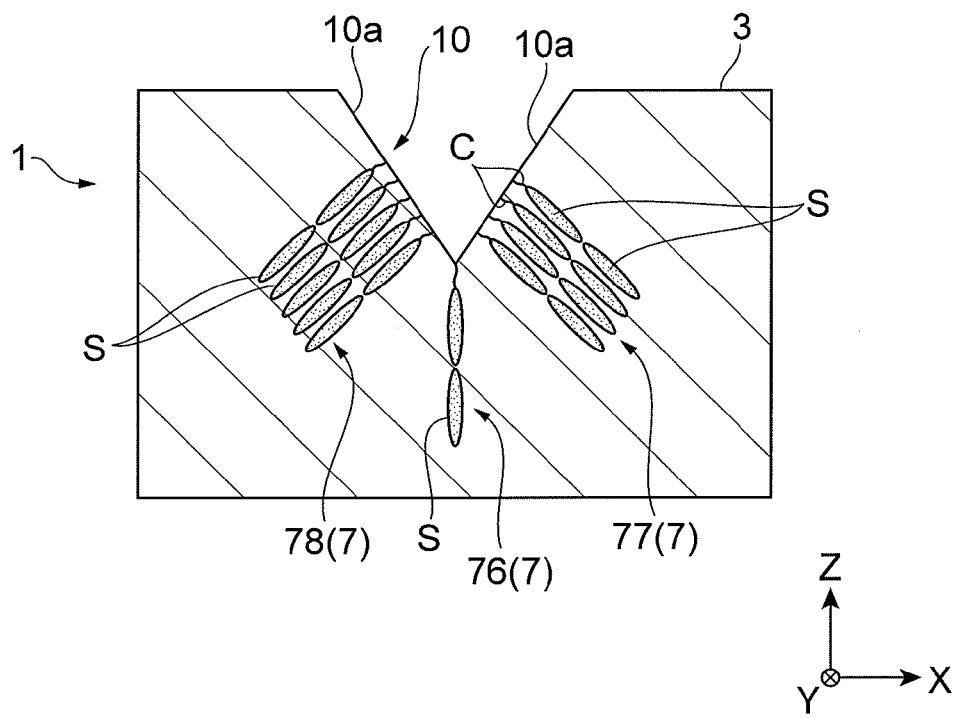
(b)
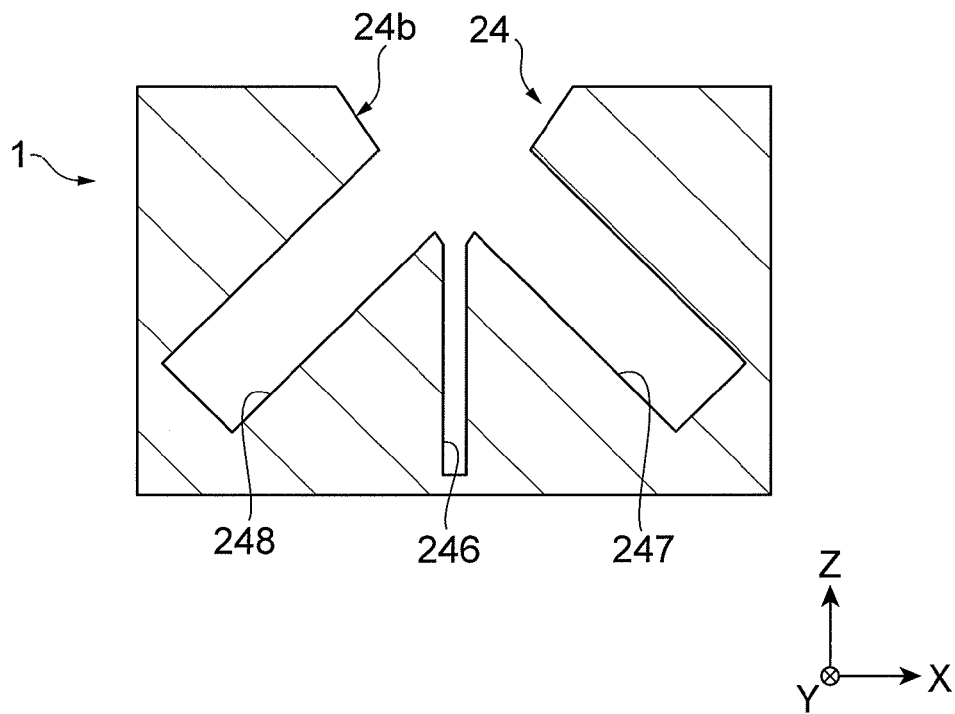

Fig.15
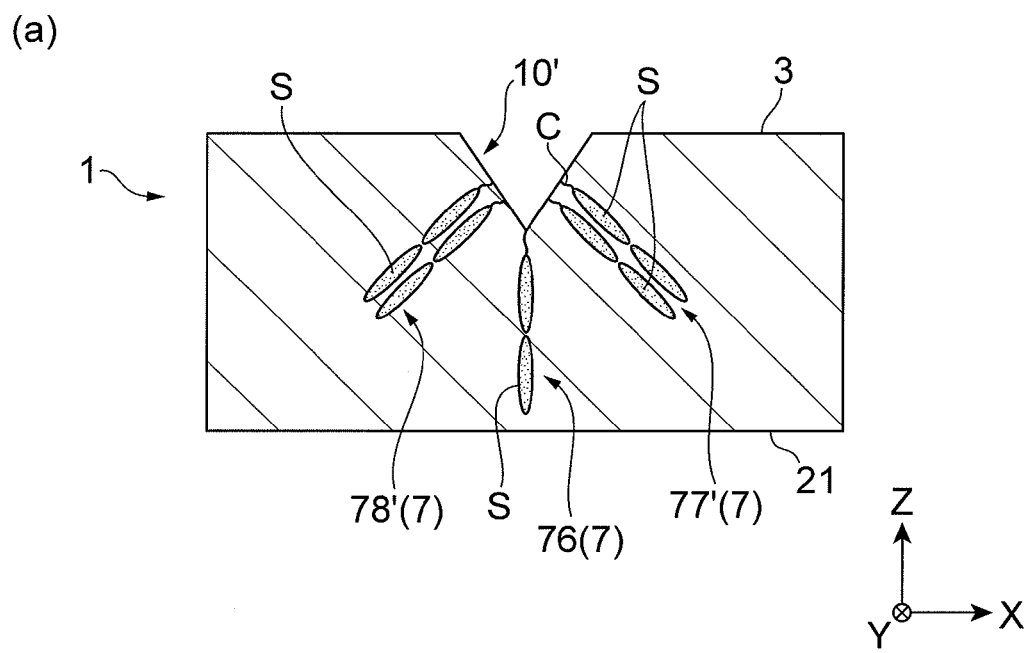
(a)
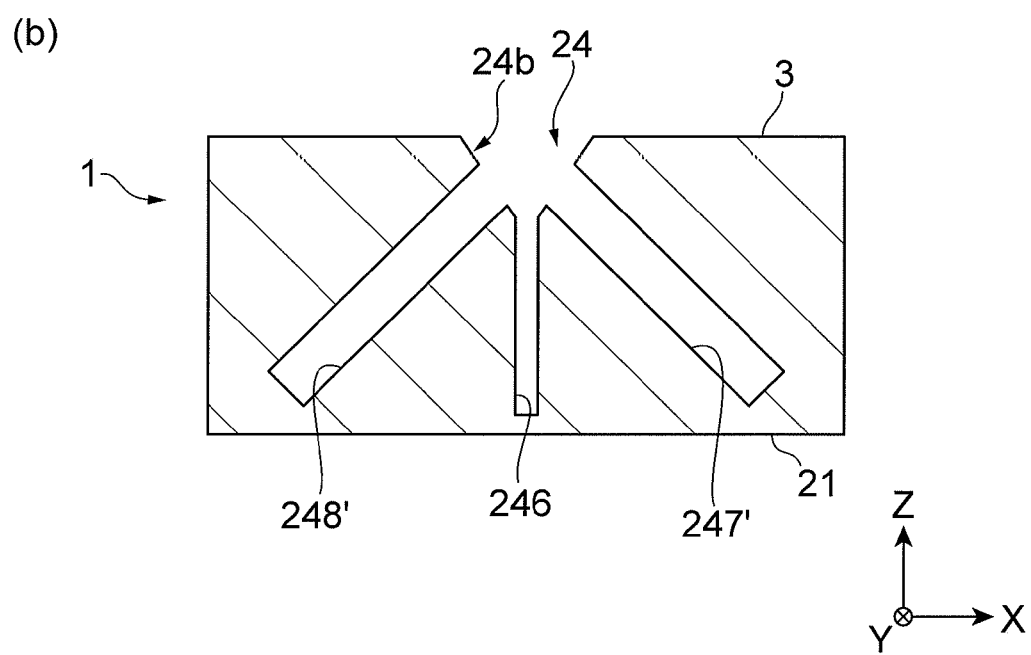
(b)

LASER PROCESSING METHOD

CROSS REFERENCE TO RELATED APPLICATION

This is a Continuation-In-Part application of PCT application No. PCT/JP2011/066319 filed on Jul. 19, 2011, claiming the benefit of priorities from Japanese Patent application No. 2010-167434 filed on Jul. 26, 2010, and incorporated by reference in their entirety.

TECHNICAL FIELD

The present invention relates to a laser processing method for forming a hole in a sheet-like object to be processed made of silicon.

BACKGROUND ART

Known as a conventional laser processing method is one comprising, as disclosed in Patent Literature 1, for example, converging a laser light into a silicon monocrystal substrate (object to be processed), so as to form a material transformed part (modified region), and then advancing etching along the material transformed part by etching the silicon monocrystal substrate, so as to remove the material transformed part and form a blind hole or through hole in the silicon monocrystal substrate.

CITATION LIST

Patent Literature

Patent Literature 1: Japanese Patent Application Laid-Open No. 2005-74663

SUMMARY OF INVENTION

Technical Problem

In laser processing methods such as the one mentioned above, on the laser light entrance surface side of the object, the straightness of fractures extending from the formed modified region may lower under the influence of the laser light L (thermal shock) and the like, thereby making the fractures meander or extend in unintended directions. In this case, when forming holes in the object by anisotropic etching, etching may progress along fractures having low straightness, thus fluctuating the size and form of the opening of the holes, thereby making it hard to control the opening width of the holes.

It is therefore an object of the present invention to provide a laser processing method which can enhance the controllability of the opening width of holes on the laser light entrance surface side.

Solution to Problem

One aspect of the present invention relates to a laser processing method. This laser processing method is a laser processing method for forming a hole in a sheet-like object to be processed made of silicon, the method comprising a depression forming step of forming a depression in a part corresponding to the hole on a laser light entrance surface side of the object, the depression opening to the laser light entrance surface; a modified region forming step of forming a modified region along a part corresponding to the hole in the object by converging a laser light at the object after the depression forming step; and an etching step of anisotropically etching the object after the modified region forming step so as to advance the etching selectively along the modified region and form the hole in the object; wherein the modified region forming step exposes the modified region or a fracture extending from the modified region to an inner face of the depression.

This laser processing method forms a depression on the laser light entrance surface side of the object and exposes a modified region or a fracture extending from the modified region to the inner face of the depression. Therefore, during anisotropic etching, an opening of a hole is formed in conformity to the shape of the depression, so as to inhibit the etching from advancing along fractures having low straightness to form the opening of the hole. This can keep such fractures from adversely affecting the opening width of the hole, thereby enhancing the controllability of the opening width of the hole on the laser light entrance surface side.

The depression forming step may form a sloped surface tilted with respect to a thickness direction of the object as the inner face of the depression, while the modified region forming step may irradiate the sloped surface with the laser light, so as to refract the laser light by the sloped surface and converge the laser light at a part corresponding to the hole in the object. In this case, the laser light is converged at the object by utilizing the refraction of the laser light by the sloped surface, whereby the position of a converging point of the laser light can be set uniquely by the sloped surface. This can reduce the necessity for the positional control of the laser light, whereby the converging point position can be restrained from shifting because of positional deviations and the like of a laser light source, for example. That is, the converging point position of the laser light can be controlled by the sloped surface so as to form the modified region accurately in the object.

Here, there is a case where the hole extends while being tilted by a predetermined angle with respect to the thickness direction, and the depression forming step forms the sloped surface tilted by an angle corresponding to a refractive index of the object for the laser light and the predetermined angle.

The modified region forming step may repeatedly perform the step of irradiating the sloped surface with the laser light while locating a condenser lens at different positions in the thickness direction, so as to form a plurality of modified spots constituting the modified region at respective distances from the sloped surface. Thus repeatedly irradiating the sloped surface with the laser light while converging it through the condenser lens located at respective positions in the thickness direction can favorably form a plurality of modified spots with different distances from the sloped surface in the object.

The modified region forming step may irradiate the sloped surface with the laser light while moving the condenser lens along the sloped surface, so as to form a plurality of modified spots constituting the modified region and aligning along the sloped surface at a fixed distance from the sloped surface. Thus irradiating the sloped surface with the laser light while moving the condenser lens along the sloped surface can favorably form a plurality of modified spots aligning along the sloped surface at a fixed distance from the sloped surface in the object.

The depression forming step may form the depression by anisotropically etching the object. In this case, when forming the depression, the desirable depression can be formed accurately in the object by utilizing a characteristic feature of the anisotropic etching that the etching rate depends on the crystal orientation of the object.

Advantageous Effects of Invention

The present invention can enhance the controllability of the opening width of holes on the laser light entrance surface side.

BRIEF DESCRIPTION OF DRAWINGS

FIG. 8 (*a*) is an end face view of the object illustrating a sequel to FIG. 7(*c*), while (*b*) is an end face view of the object illustrating a sequel to FIG. 8(*a*);

FIG. 9 (*a*) is an end face view of the object for explaining the laser processing method in accordance with a second embodiment, while (*b*) is an end face view of the object illustrating a sequel to FIG. 9(*a*);

FIG. 10 (*a*) is an end face view of the object for explaining the forming of a modified region in the second embodiment, while (*b*) is an end face view of the object illustrating a sequel to FIG. 10(*a*);

FIG. 11 (*a*) is an end face view of the object for explaining the laser processing method in accordance with a third embodiment, (*b*) is an end face view of the object illustrating a sequel to FIG. 11(*a*), and (*c*) is an end face view of the object illustrating a sequel to FIG. 11(*b*);

FIG. 12 (*a*) is an end face view of the object illustrating a sequel to FIG. 11(*c*), (*b*) is an end face view of the object illustrating a sequel to FIG. 12(*a*), and (*c*) is an end face view of the object illustrating a sequel to FIG. 12(*b*);

FIG. 13 (*a*) is an end face view of the object for explaining the laser processing method in accordance with a fourth embodiment, while (*b*) is an end face view of the object illustrating a sequel to FIG. 13(*a*);

FIG. 15 (*a*) is an end face view of the object for explaining a modified example of the fourth embodiment, while (*b*) is an end face view of the object illustrating a sequel to FIG. 15(*a*).

DESCRIPTION OF EMBODIMENTS

Figure 1:
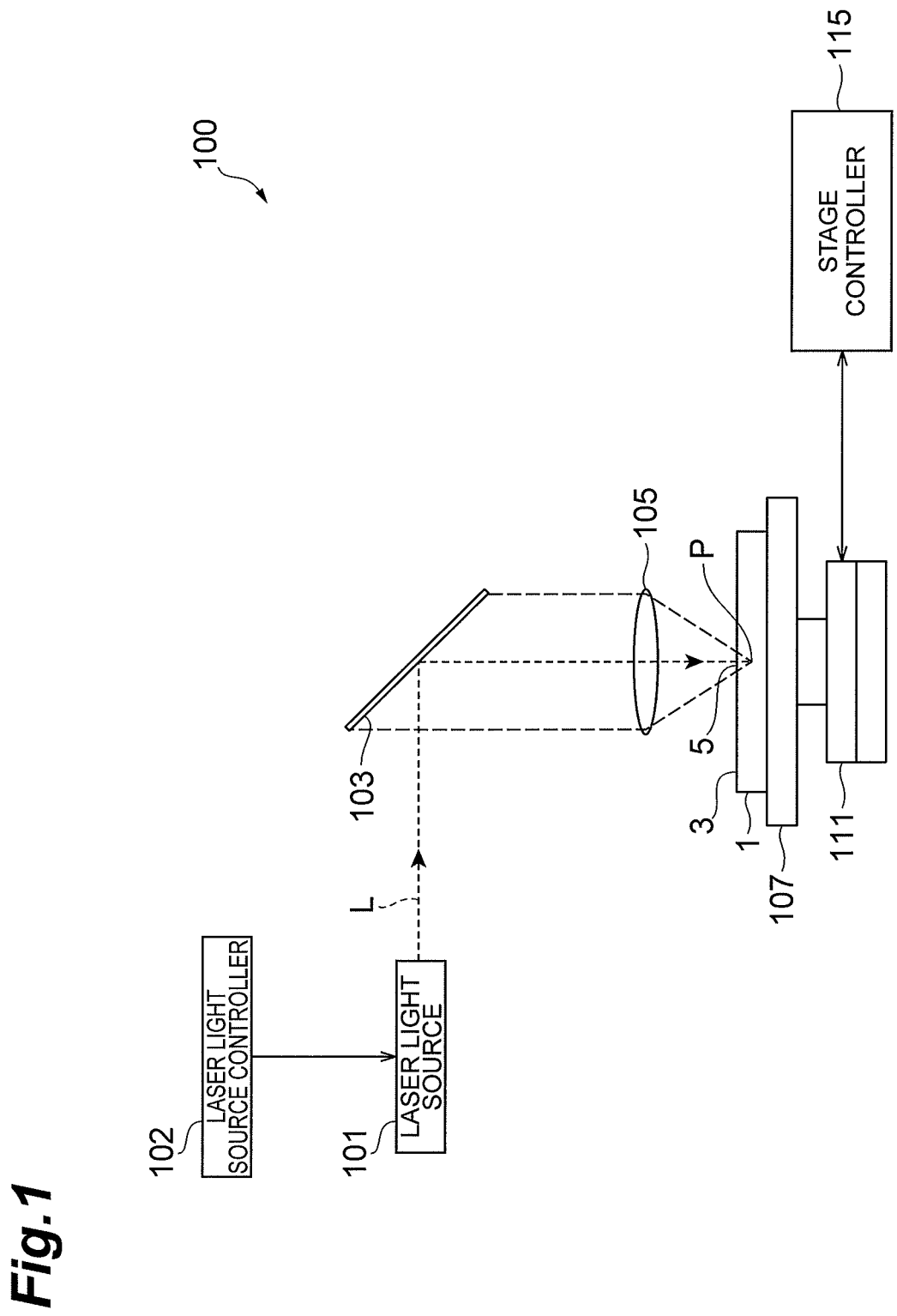
FIG. 1 is a schematic structural diagram of a laser processing device used for forming a modified region.

In the following, preferred embodiments of the present invention will be explained in detail with reference to the drawings. In the drawings, the same or equivalent constituents will be referred to with the same signs while omitting their overlapping descriptions.

The laser processing method in accordance with an embodiment converges a laser light into a object to be processed, so as to form a modified region. Therefore, the forming of the modified region will firstly be explained in the following with reference to FIGS. 1 to 6.

As illustrated in FIG. 1, a laser processing device 100 comprises a laser light source 101 which causes a laser light (processing laser light) L to oscillate in a pulsating manner, a dichroic mirror 103 arranged such as to change the direction of the optical axis (optical pass) of the laser light L by 90°, and a condenser lens 105 for converging the laser light L. The laser processing device 100 also comprises a support table 107 for supporting a object to be processed 1 irradiated with the laser light L converged by the condenser lens 105, a stage 111 for moving the support table 107, a laser light source controller 102 for controlling the laser light source 101 in order to regulate the output, pulse width, and the like of the laser light L, and a stage controller 115 for controlling the movement of the stage 111.

In the laser processing device 100, the laser light L emitted from the laser light source 101 changes the direction of its optical axis by 90° with the dichroic mirror 103 and then is converged by the condenser lens 105 into the object 1 mounted on the support table 107. At the same time, the stage ill is shifted, so that the object 1 moves relative to the laser light L along a line to form a modified region 5. This forms a modified region in the object 1 along the line 5.

Figure 2:
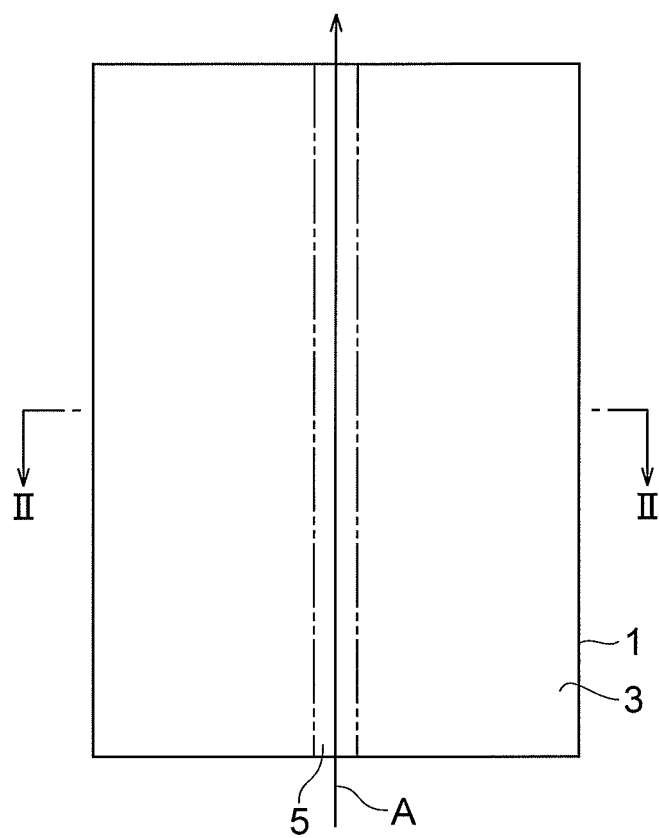
FIG. 2 is a plan view of a object to be processed in which the modified region is to be formed.
Figure 3:
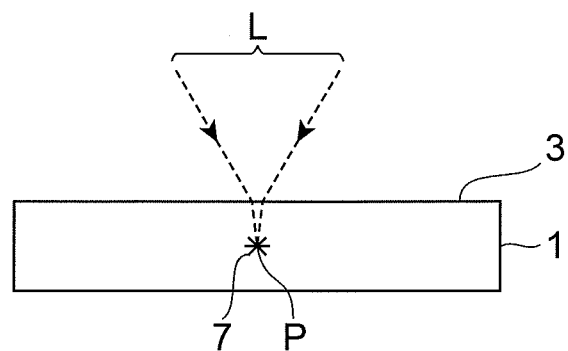
FIG. 3 is a sectional view of the object taken along the line III-III of FIG. 2.
Figure 4:
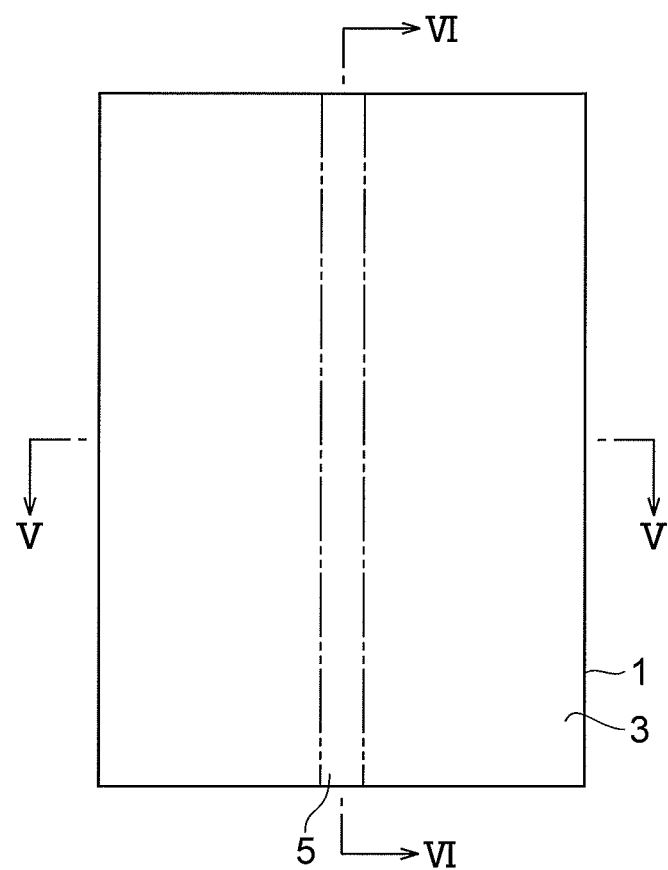
FIG. 4 is a plan view of the object after laser processing.
Figure 5:
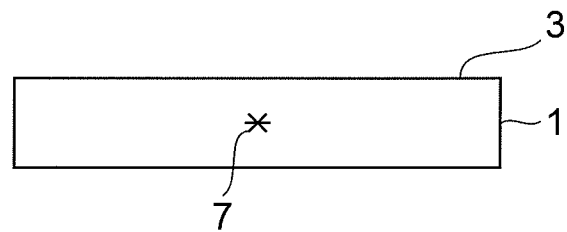
FIG. 5 is a sectional view of the object taken along the line V-V of FIG. 4.
Figure 6:
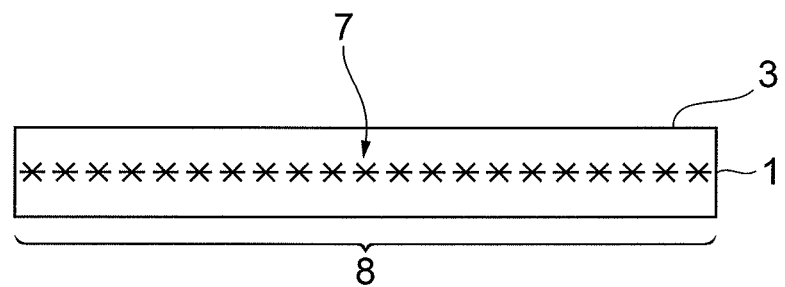
FIG. 6 is a sectional view of the object taken along the line VI-VI of FIG. 4.

As illustrated in FIG. 2, the line 5 is set in the object 1, for which a semiconductor material, a piezoelectric material, or the like is used. Here, the line 5 is a virtual line extending straight. When forming a modified region within the object 1, the laser light L is relatively moved along the line 5 (i.e., in the direction of arrow A in FIG. 2) while locating a converging point P within the object 1 as illustrated in FIG. 3. This forms a modified region 7 within the object 1 along the line 5 as illustrated in FIGS. 4 to 6, whereby the modified region 7 becomes a removing region 8 to be removed by etching which will be explained later.

The converging point P is a position at which the laser light L is converged. The line 5 may be curved instead of being straight, shaped into a three-dimensional form combining them, or specified in terms of coordinates. The modified region 7 may be formed either continuously or intermittently. The modified region 7 may be formed like lines or dots. It will be sufficient if the modified region 7 is formed at least within the object 1. There are cases where fractures are formed from the modified region 7 acting as a start point, and the fractures and modified region 7 may be exposed at outer surfaces (the front face, rear face, and side face) of the object 1.

Here, the laser light L is absorbed in particular in the vicinity of the converging point P within the object 1 while being transmitted therethrough, whereby the modified region 7 is formed in the object 1 (i.e., internal absorption type laser processing). In the case of forming a removing part such as a hole or groove by melting it away from the front face 3, the processing region gradually progresses from the front face 3 side to the rear face side (i.e., surface absorption type laser processing) in general.

The modified region 7 in accordance with this embodiment means regions whose physical characteristics such as density, refractive index, and mechanical strength have attained states different from those of their surroundings. Examples of the modified region 7 include molten processed regions, crack regions, dielectric breakdown regions, refractive index changed regions, and their mixed regions. Further examples of the modified region include an area where the density of the modified region has changed from that of an unmodified region in a material of the object and an area formed with a lattice defect (which may collectively be referred to as a high-density transitional region).

The molten processed regions, refractive index changed regions, areas where the modified region has a density different from that of the unmodified region, or areas formed with a lattice defect may further incorporate a fracture (cut or microcrack) therewithin or at an interface between the modified region 7 and an unmodified region. The incorporated fracture may be formed over the whole surface of the modified region or in only a part or a plurality of parts thereof. Examples of the object 1 include those containing or constituted by silicon.

Here, this embodiment forms the modified region 7 in the object 1 and then etches the object 1, so as to advance the etching selectively along the modified region 7 (i.e., along the modified region, fractures included in the modified region 7, or fractures from the modified region 7), thereby removing a part extending along the modified region 7 in the object 1. These fractures are also known as cracks, microcracks, cuts, and the like (hereinafter simply referred to as "fractures").

In the etching in this embodiment, for example, a capillary action or the like is utilized so that fractures included in the modified region 7 of the object 1 or fractures from the modified region 7 are impregnated with an etchant, so as to advance the etching along fracture surfaces. This advances the etching selectively at a higher etching rate (etching speed) along the fractures in the object 1 and removes them. At the same time, by utilizing the characteristic feature that the etching rate of the modified region 7 itself is high, the etching is selectively advanced along the modified region 7, so as to remove it.

Examples of the etching include a case where the object is immersed in the etchant (dipping) and a case where the object is coated with the etchant while being rotated (spin etching).

Examples of the etchant include KOH (potassium hydroxide), TMAH (aqueous tetramethylammonium hydroxide solution), EDP (ethylenediamine pyrocatechol), NaOH (sodium hydroxide), CsOH (cesium hydroxide), $NH_4OH$ (ammonium hydroxide), and hydrazine. The etchant to be used is not limited to liquids but may be in the form of a gel (jelly or semisolid). Here, the etchant is used at a temperature ranging from ambient temperature to about 100° C., which is set appropriately according to a required etching rate or the like. When the object 1 made of silicon is etched with KOH, for example, the temperature is preferably set to about 60° C.

As the etching, this embodiment performs anisotropic etching which is etching having a higher (or lower) etching rate in a specific direction based on a crystal orientation. The anisotropic etching is applicable not only to relatively thin object but also to thick ones (having a thickness of 800 μm to 100 μm, for example). In this case, even when the surface to be formed with the modified region 7 differs from its plane direction, the etching can be advanced along the modified region 7. That is, the anisotropic etching here enables not only the etching of the plane direction in conformity to the crystal orientation, but also the etching independent of the crystal orientation.

First Embodiment

Figure 7:
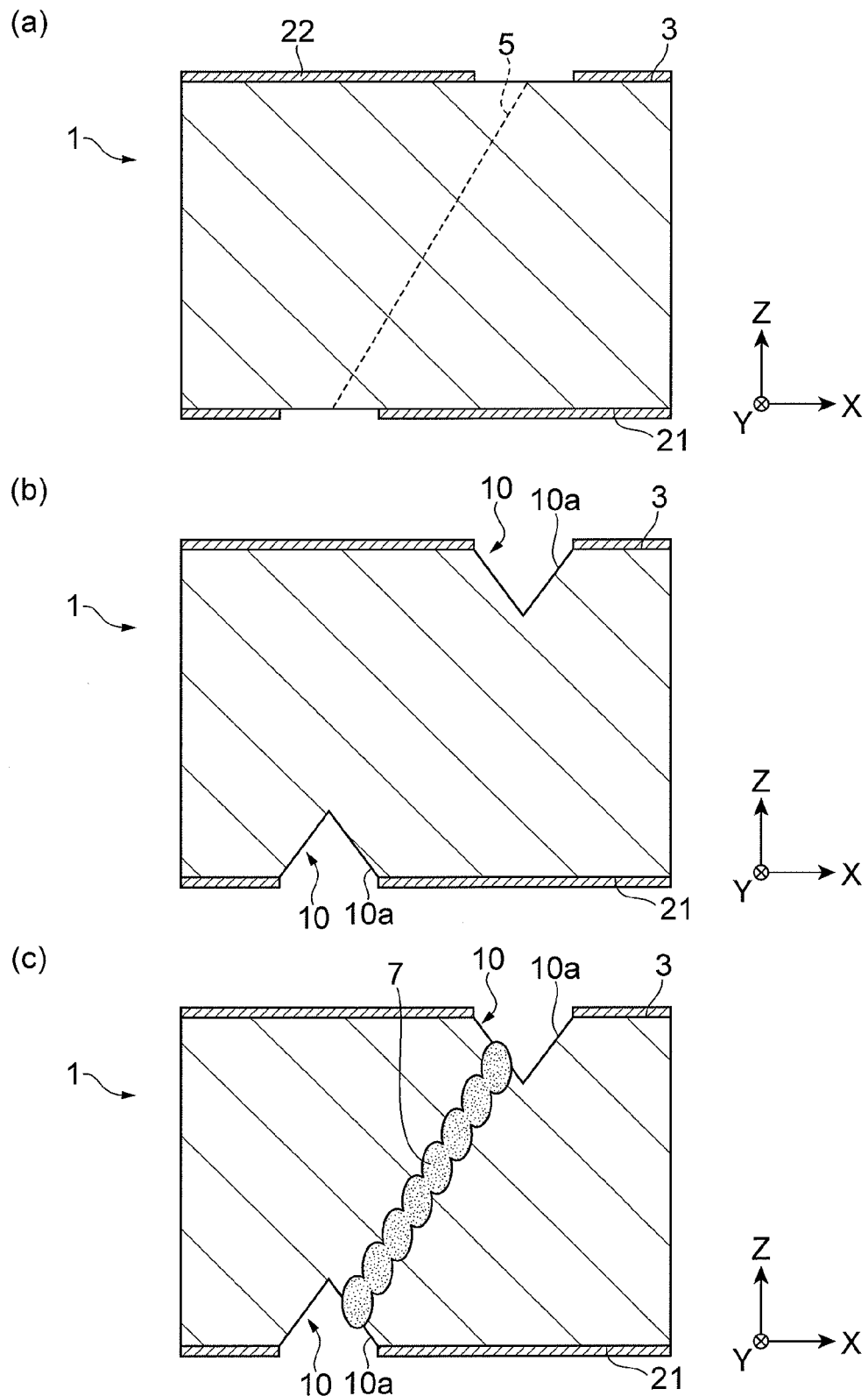
FIG. 7 (*a*) is an end face view of the object for explaining the laser processing method in accordance with a first embodiment, (*b*) is an end face view of the object illustrating a sequel to FIG. 7(*a*), and (*c*) is an end face view of the object illustrating a sequel to FIG. 7(*b*)

The laser processing method in accordance with the first embodiment of the present invention will now be explained. FIGS. 7 and 8 are flow diagrams for explaining this embodiment. As illustrated in FIGS. 7 and 8, this embodiment forms pits (depressions) 10, 10 on the front face 3 side and rear face 21 face side of the object 1, converges the laser light L at the object 1, so as to form a modified region 7, and removes a part extending along the modified region 7 in the object 1 by anisotropic etching, thereby forming a through hole 24.

The object 1 is a silicon substrate transparent to the wavelength (e.g., 1064 nm) of the laser light L with which it is irradiated and has the front face 3 and rear face 21 that are (100) planes. At a position corresponding to the through hole 24, the line 5 is programmably set as being specified by three-dimensional coordinates. The through hole 24 extends obliquely with respect to the thickness direction of the object 1. Here, the through hole 24 extends along a (111) plane of the object 1, while forming an angle of 35°, for example, with the thickness direction of the through hole 24.

The following explanation will assume the thickness direction of the object 1 (the irradiation direction of the laser light; the vertical direction on the paper surface) to be the Z direction, the lateral direction (the horizontal direction on the paper surface) toward which the through hole 24 tilts with respect to the thickness direction to be the X direction, and the direction (the direction normal to the paper surface) orthogonal to the X and Z directions to be the Y direction.

First, when processing the object 1 in this embodiment, etch-resistant films 22 made of SiN (silicon nitride) or the like which is resistant to etch are formed on the front and rear faces 3, 21 of the object. At the same time, the etch-resistant films 22 are patterned so as to form openings at parts corresponding to the through hole 24. Subsequently, as illustrated in FIG. 7(b), the object 1 is anisotropically etched, so as to form pits 10 as openings in the respective parts corresponding to the through hole 24 on the front face 3 side and rear face 21 side.

The pits 10, 10 are provided so as to open to the front and rear faces 3, 21, respectively. Here, each pit 10 is formed so as to be depressed like a quadrangular pyramid into the object 1 and has a sloped surface 10a along the (111) plane of the object 1 as an inner face.

Next, the object 1 is mounted and held on the mount table such that the front face 3 faces up. Subsequently, the object 1 is irradiated (scanned) with the laser light L in an on/off manner from the front face 3 side, while locating a converging point of the laser light L (hereinafter simply referred to as "converging point") on the rear face 21 side within the object 1 and moving the converging point in the Y direction, such as to form the modified region 7 along the line 5. Specifically, the object 1 is scanned with converging points (modified regions 7) at predetermined pitches in the Y direction (i.e., laser irradiation is performed at predetermined pitch intervals, so as to form the modified regions 7 by the number of laser irradiation shots). Here, it is desirable that the modified regions 7 be formed such that the respective modified regions 7 formed by the laser irradiation shots partly overlap each other in the Y direction. In this embodiment, the laser light L is a pulsed laser light. The scan is repeatedly performed, while progressively changing the Z-direction position of the converging point from the rear face 21 side to the front face 3 side.

This forms the modified regions 7 joining each other along the part corresponding to the through hole 24 in the object 1 such that they are exposed to the inner faces of the pits 10. In other words, the modified regions 7 continuously extending along the (111) plane of the object 1 so as to connect the pits 10, 10 on the front and rear faces 3, 21 to each other are formed so as to be exposed to the sloped surfaces 10a of the pits 10. Here, since spot irradiation is performed with a pulsed laser light as the laser light L, the modified regions 7 formed thereby are constituted by modified spots. Thus formed modified regions 7 and modified spots include fractures generated from the modified regions 7 and modified spots (ditto in the following).

Next, the object 1 is anisotropically etched with KOH at 85° C. as an etchant, for example. This etches the vicinity of the pits 10 in the object 1 and causes the etchant to invade and wet the modified regions 7 as illustrated in FIG. 8(a), thereby selectively advancing (evolving) the etching along the modified regions 7. As a result, as illustrated in FIG. 8(b), the part of the object 1 extending along the modified regions 7 is etched away in an extending manner, so as to form the through hole 24 reaching the front and rear faces 3, 21 such as to connect the pits 10, 10 to each other.

Here, in the anisotropic etching for the object 1, the etching rate depends on the crystal orientation of the object 1 and thus becomes so slow in the (111) plane in the object 1 compared to other parts that the etching stops. Therefore, in the modified regions 7 extending along the (111) plane, the etching advances selectively at a high speed in particular along their extending direction, while the inner face 24a of the through hole 24 formed thereby becomes smooth as their irregularities are etched away, whereby a mirror surface is formed on the inner face 24a. For example, the surface roughness of the inner face 24a is such that the arithmetic mean roughness Ra=0.12 μm (ten-point average roughness Rz=2.36 μm).

Meanwhile, there are typical cases where the straightness of fractures extending from the modified regions 7 on the front face 3 side acting as the laser light entrance surface of the object 1 becomes lower than that of fractures extending from the modified regions 7 on the rear face 21 side under the influence (thermal shock) and the like of the laser light L, for example. As a consequence, the fractures from the modified regions 7 on the front face 3 side may meander, extend in unintended directions, and so forth. This may advance the etching along fractures having low straightness during the anisotropic etching, thereby fluctuating the size and form of the opening 24b of the through hole 24 on the front face 3 side, which makes it hard to control the opening width of the through hole 24 (the size of the opening 24b).

In this regard, the pit 10 is formed on the front face 3 side of the object 1 in this embodiment as mentioned above, so that the modified region 7 is exposed to the sloped surface 10a of the pit 10 and contained in the pit 10. Therefore, during the anisotropic etching, the opening 24b of the through hole 24 on the front face 3 side of the object 1 is not formed as the etching advances along the fractures having low straightness, but in conformity to the shape of the pit 10. Therefore, this embodiment can inhibit the fractures having low straightness from adversely affecting the opening width of the through hole 24 and enhance the controllability of the opening width of the through hole 24 on the front face 3 side.

As mentioned above, the modified regions 7 are formed along the (111) plane of the object 1 in this embodiment. Therefore, selectively advancing the etching along the modified regions 7 by anisotropic etching can form a mirror surface, which is a smooth surface with less irregularities, on the inner face 24a of the through hole 24 and yield a rectangular (diamond-shaped) cross section in the through hole 24.

As mentioned above, this embodiment forms the pits 10 by anisotropically etching the object 1. Therefore, when forming the pits 10, the desirable pits 10 can be formed easily and accurately in the object 1 by utilizing a characteristic feature of the anisotropic etching that its etching rate depends on the crystal orientation of the object 1.

Though this embodiment exposes the modified regions 7 themselves to the sloped surfaces 10a of the pits 10, fractures from the modified regions 7 may be exposed instead of the modified regions 7. It will be sufficient if the modified regions or fractures extending from the modified regions 7 are exposed. This also holds in embodiments which will follow.

Second Embodiment

The second embodiment of the present invention will now be explained. This embodiment will be explained mainly in terms of points different from the above-mentioned first embodiment.

FIG. 9 is a flow diagram for explaining this embodiment, while FIG. 10 is a view for explaining the forming of a modified region in this embodiment. The laser processing method in accordance with this embodiment forms a branched hole 24 in the object 1 as illustrated in FIG. 9. The branched hole 24 includes an opening 24b shaped like a V-groove and disposed on the front face 3 side, a vertical part 241 extending from the bottom part of the opening 24b in the Z direction, and tilted parts 242, 243 extending from the respective opposing tilted surfaces of the opening 24b in directions tilted with respect to the Z direction.

First, as illustrated in FIG. 9(a), the V-groove pit 10 opening to the front face 3 is formed at a position corresponding to the opening 24b on the front face 3 side of the object 1 in this embodiment. Subsequently, a plurality of modified spots S are formed along the parts corresponding to the vertical part 241 and tilted parts 242, 243, so as to produce modified regions 71 to 73.

Specifically, the above-mentioned scan is performed such as to form the modified spot S1 in the part corresponding to the vertical part 241. The scan for forming the modified spot S1 is repeatedly performed while changing the converging point position in the Z direction by moving the condenser lens 105 by a predetermined amount in the Z direction. Here, the condenser lens 105 is moved from the rear face 21 side to the front face 3 side such that the converging point position in the Z direction progresses from the rear face 21 side to the front face 3 side. This forms a modified region 71 constituted by a plurality of modified spots S1 along the part corresponding to the vertical part 241 in the object 1. In the modified region 71 here, the modified spot S1 on the front face 3 side is exposed to the bottom part of the pit 10.

The above-mentioned scan is also performed so as to form modified spot S2 in the part corresponding to the tilted part 242. More specifically, as illustrated in FIG. 10(a), the sloped surface 10a of the pit 10 is irradiated with the laser light L in an on/off manner, so that the laser light L is refracted by the sloped surface 10a and converged at the part corresponding to the tilted part 242 in the object 1, whereby the modified spot S2 is formed.

Here, the angle of inclination of the sloped surface 10a with respect to the Z direction is 35°, so that the angle of convergence of the laser light L incident on the sloped surface 10a along the Z direction and refracted thereby is set to 43.3° according to the following relationship of refractive indexes. That is, when forming the pit 10, the sloped surface 10a is tilted by an angle corresponding to the refractive index of the object 1 for the laser light L and the angle of inclination (predetermined angle) of the tilted surface 242 with respect to the Z direction. The angle of convergence means the angle of the optical axis of the laser light L with respect to the X direction.

The refractive index of air=1.0. The refractive index of the object 1=3.5.

Subsequently, as illustrated in FIG. 10(b), the scan for forming the modified spot S2 is repeatedly performed while changing the converging point position in the direction along the tilted part 242 (i.e., the converging point position in the depth direction of the sloped surface 10a) by moving the condenser lens 105 by a predetermined amount in the Z direction. Here, the condenser lens 105 is moved from the rear face 21 side to the front face 3 side such that the converging point position progresses from the rear side to the front side in the depth direction of the sloped surface 10a. This forms a modified region 72 constituted by a plurality of modified spots S2 along the part corresponding to the tilted part 242. In the modified region 72 here, a fracture C extending from the modified spot S2 on the front face 3 side is exposed to the sloped surface 10a of the pit 10.

As with the forming of the above-mentioned modified spots S2 and modified region 72, the above-mentioned scan is repeatedly performed along the part corresponding to the tilted part 243 while changing the converging point position, so as to form a modified region 73 constituted by a plurality of modified spots S3. Thereafter, as illustrated in FIG. 9(b), the object 1 is anisotropically etched, so as to advance the etching selectively along the modified regions 7. As a result, the parts of the object 1 extending along the modified regions 7 are etched away, so as to form the branched hole 24.

As in the foregoing, this embodiment yields effects similar to those mentioned above, namely, inhibits fractures having low straightness from adversely affecting the opening width of the branched hole 24 and enhances the controllability of the opening width of the branched hole 24. Also, this embodiment exposes the fracture C to the sloped surface 10a of the pit 10 as mentioned above and thus can improve the straightness of the fracture C as compared with the case where fractures are exposed to the front face 3.

As mentioned above, this embodiment irradiates the sloped surface 10a with the laser light L, so that the laser light L is refracted by the sloped surface 10a, so as to be converged. This can converge the laser light L into the object 1 by utilizing the refraction of the laser light L by the sloped surface 10a, so that the converging point position of the laser light L can be set uniquely by the sloped surface 10a. As a result, the necessity for positional control of the laser light L can be reduced, whereby the converging point position can be restrained from shifting because of positional deviations and the like of the laser light source 101 (see FIG. 1), for example. That is, controlling the converging point position of the laser light L by the sloped surface 10a can accurately form the modified regions 7 in the object 1.

In particular, this embodiment forms a plurality of modified spots S at different distances from the sloped surface 10a by moving the condenser lens 105 only in the Z direction and thus can reduce the necessity for moving the condenser lens 105 in both of the Z and X directions so as to shift the converging point. Therefore, the modified regions 7 can easily be formed in the object 1.

Third Embodiment

The third embodiment of the present invention will now be explained. This embodiment will be explained mainly in terms of points different from the above-mentioned second embodiment.

FIGS. 11 and 12 are flow diagrams for explaining this embodiment. As illustrated in FIG. 12, the laser processing method in accordance with this embodiment is used for making a bleeder circuit board 51 and forms a plurality of (two here) branched through holes 24 in the object 1. Each branched through hole 24 includes an opening 24b shaped like a V-groove and tilted parts 244, 245 extending from the respective opposing tilted surfaces of the opening 24b in directions tilted with respect to the Z direction.

This embodiment firstly forms and patterns an etch-resistant film 22 on the front face 3 of the object 1 as illustrated in FIG. 11(a) and then anisotropically etches the object 1 so as to form a plurality of pits 10, 10 on the front face 3 side of the object 1 as illustrated in FIG. 11(b). Subsequently, the etch-resistant film 22 is removed, and then a plurality of modified spots S are formed along the parts corresponding to the tilted parts 244, 245 of the branched through holes 24 as illustrated in FIG. 11(c), so as to produce modified regions 7.

Specifically, the sloped surface 10a of the pit 10 is irradiated with the laser light L, so that the laser light L is refracted by the sloped surface 10a and converged at the part corresponding to the tilted part 244 in the object 1, whereby a modified spot S is formed. This is repeatedly performed while changing the converging point position by moving the condenser lens 105 by a predetermined amount in the Z direction, so as to form a modified region 74 constituted by a plurality of modified spots S along the part corresponding to the tilted part 244. Similarly, a modified region 75 constituted by a plurality of modified spots S is formed along the part corresponding to the tilted part 245 in the object 1. Here, the modified regions 74, 75 are formed such that the modified spots S on the front face 3 side are exposed to the sloped surfaces 10a of the pits 10.

Subsequently, the object 1 is anisotropically etched, so as to advance the etching selectively along the modified regions 7 as illustrated in FIG. 12(a). As a result, the parts extending along the modified regions 7 in the object 1 are etched away, whereby a plurality of branched holes 24, 24 are formed. Thereafter, as illustrated in FIG. 12(b), oxide films 200 are formed on the inner faces of the branched holes 24, 24, the front face, and the rear face 21 by thermal oxidation. Subsequently, as illustrated in FIG. 12(c), a conductor 13 is inserted into the branched through holes 24, 24, and pads 14 are formed within the opening 24b and on the rear face 21 so as to electrically connect with the conductor 13. This forms a bleeder circuit board 51 which enables 1:N electrical connections (where N is an integer of 2 or greater).

As in the foregoing, this embodiment yields effects similar to those mentioned above, namely, inhibits fractures having low straightness from adversely affecting the opening width of the branched hole 24 and enhances the controllability of the opening width of the branched hole 24.

As with the above-mentioned embodiment, this embodiment irradiates the sloped surface 10a with the laser light L, so that the laser light L is refracted by the sloped surface 10a, so as to be converged, whereby the converging point position of the laser light L can be controlled by the sloped surface 10a, which makes it possible to form the modified regions 7 accurately in the object 1.

Fourth Embodiment

The fourth embodiment of the present invention will now be explained. This embodiment will be explained mainly in terms of points different from the above-mentioned second embodiment.

Figure 14:
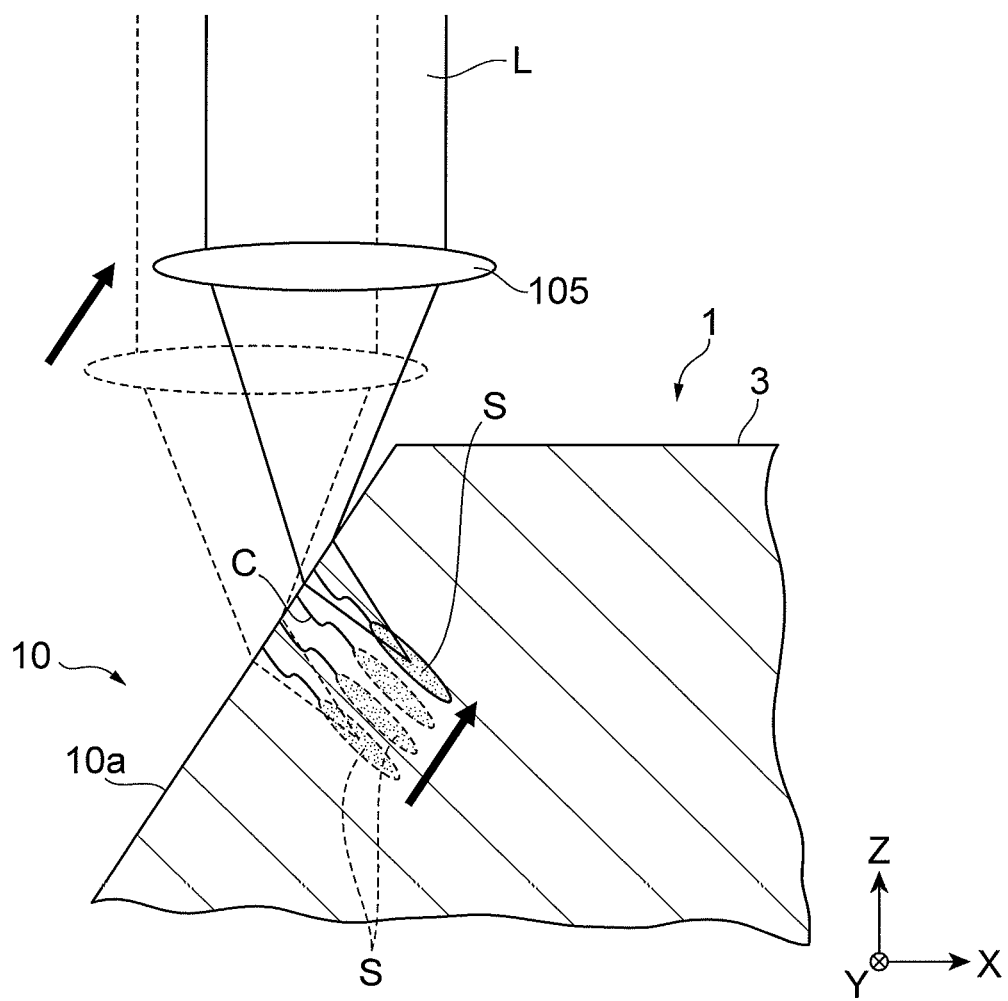
FIG. 14 is an end face view of the object for explaining the forming of a modified region in the fourth embodiment.

FIG. 13 is a flow diagram for explaining this embodiment, while FIG. 14 is a view for explaining the forming of a modified region in this embodiment. The laser processing method in accordance with this embodiment forms a branched hole 24 in the object 1 as illustrated in FIG. 13. The branched hole 24 includes an opening 24b shaped like a V-groove, a vertical part 246 extending from the bottom part of the opening 24b in the Z direction, and tilted parts 247, 248 which are wider than the vertical part 246 and extend from the respective opposing tilted surfaces of the opening 24b in directions tilted with respect to the Z direction.

First, as illustrated in FIG. 13(a), the V-groove pit 10 opening to the front face 3 is formed at a position corresponding to the opening 24b on the front face 3 side of the object 1 in this embodiment. Subsequently, a plurality of modified spots S are formed along the parts corresponding to the vertical part 246 and tilted parts 247, 248 (see FIG. 13(b)), so as to produce modified regions 76 to 78.

Here, as illustrated in FIG. 14, the laser light L is emitted (scanned) in an on/off manner, while moving the condenser lens 105 along the X direction and in the Z direction so as to follow the sloped surface 10a (i.e., such that the distance between the condenser lens 105 and the sloped surface 10a becomes constant). As a result, the sloped surface 10a is irradiated with the laser light L moving along the sloped surface 10a, so that the laser light L is refracted by the sloped surface 10a, so as to be converged into the object 1, whereby a plurality of (four here) modified spots S equally distanced from the sloped surface 10a are formed such as to align along the sloped surface 10a. Here, "equal" encompasses substantially equal and means that their difference is small.

Then, the scan is repeatedly performed while changing the converging point position by moving the condenser lens 105 by a predetermined amount in the Z direction. This forms the modified regions 76 to 78 constituted by a plurality of modified spots S along the parts corresponding to the vertical part 246 and tilted parts 247, 248 as illustrated in FIG. 13(a). Thereafter, the object 1 is anisotropically etched, so as to advance the etching selectively along the modified regions 7 as illustrated in FIG. 13(b). As a result, the parts extending along the modified regions 7 in the object 1 are removed, whereby the branched hole 24 is formed.

As in the foregoing, this embodiment yields effects similar to those mentioned above, namely, inhibits fractures having low straightness from adversely affecting the opening width of the branched hole 24 and enhances the controllability of the opening width of the branched hole 24.

As with the above-mentioned embodiment, this embodiment irradiates the sloped surface 10a with the laser light L, so that the laser light L is refracted by the sloped surface 10a, so as to be converged, whereby the converging point position of the laser light L can be controlled by the sloped surface 10a, which makes it possible to form the modified regions 7 accurately in the object 1.

In particular, this embodiment irradiates the sloped surface 10a with the laser light L while moving the condenser lens 105 so as to follow the sloped surface 10a as mentioned above. Therefore, a plurality of modified spots S, equally distanced from the sloped surface 10a, aligning along the sloped surface 10a can be formed favorably in the object 1.

By appropriately controlling the size of the pit 10 to be formed, this embodiment can regulate the range of modified spots S which can be arranged in a row along the sloped surface 10a, so as to manage the width (aperture size) of the tilted parts 247, 248. That is, as illustrated in FIG. 15(a), for example, a pit 10' smaller than the above-mentioned pit 10 (see FIG. 13(a)) of this embodiment is formed in the object 1, and modified regions 77', 78' in which the number of modified spots S aligning along the sloped surface 10a is smaller than in the modified regions 77, 78 are formed. As a result, subsequent anisotropic etching forms a branched hole 24 having tilted parts 247', 248' narrower than the tilted parts 247, 248 as illustrated in FIG. 15(b).

Though preferred embodiments of the present invention have been explained in the foregoing, the present invention is not limited thereto but may be modified or applied to others within the scope not changing the gist recited in each claim.

For example, the laser light entrance surface for forming the modified region 7 is not, limited to the front face 3 of the object 1, but may be the rear face 21 of the object 1. Though the pits 10 are formed on the front face 3 side and rear face 21 side in the above-mentioned first embodiment, there is a case where the pit 10 is formed on the front face 3 side alone.

The on/off irradiation with the laser light L in the above-mentioned embodiments may be performed not only by controlling the on/off of the emission of the laser light L, but also by opening/closing a shutter disposed on the optical path of the laser light L or by masking on/off the front face 3 of the object 1, for example. Further, the intensity of the laser light L may be controlled between an intensity at a threshold for forming the modified region (processing threshold) or higher and an intensity lower than the processing threshold.

The hole formed by the present invention is not limited to the above-mentioned embodiments, but may be any of various holes. For example, it may be any of through and blind holes or any of branched and unbranched holes, either tilting with respect to the Z direction or extending along the Z direction. The hole may have either a circular or polygonal cross section.

Since doping the etchant with an additive can change the etching rate in a specific crystal orientation, the etchant may be doped with an additive corresponding to the crystal orientation of the object 1 in order to perform anisotropic etching at a desirable etching rate.

INDUSTRIAL APPLICABILITY

The present invention can enhance the controllability of the opening width of holes on the laser light entrance surface side.

REFERENCE SIGNS LIST

1 . . . object to be processed; 3 . . . front face (laser light entrance surface); 7, 71 to 78, 77', 78' . . . modified region; 10, 10' . . . pit (depression); 10a . . . sloped surface (inner face); 24 . . . through hole, branched hole, branched through hole (hole); 105 . . . condenser lens; C . . . fracture; L . . . laser light; S . . . modified spot

The invention claimed is:

1. A laser processing method for forming a hole in a sheet-like object to be processed made of silicon, the method comprising:
   a depression forming step of forming a depression in a part corresponding to the hole on a laser light entrance surface side of the object, the depression opening to the laser light entrance surface;
   a modified region forming step of forming a modified region along a part corresponding to the hole in the object by converging a laser light at the object after the depression forming step, the modified region being formed by a plurality of modified spots; and
   an etching step of anisotropically etching the object after the modified region forming step so as to advance the etching selectively along the modified region and form the hole in the object;
   wherein the modified region forming step exposes the modified region or a fracture extending from the modified region to an inner face of the depression.

2. A laser processing method according to claim 1, wherein the depression forming step forms a sloped surface tilted with respect to a thickness direction of the object as the inner face of the depression; and
   wherein the modified region forming step irradiates the sloped surface with the laser light, so as to refract the laser light by the sloped surface and converge the laser light at a part corresponding to the hole in the object.

3. A laser processing method according to claim 2, wherein the hole extends while being tilted by a predetermined angle with respect to the thickness direction; and wherein the depression forming step forms the sloped surface tilted by an angle corresponding to a refractive index of the object for the laser light and the predetermined angle.

4. A laser processing method according to claim 2, wherein the modified region forming step repeatedly performs the step of irradiating the sloped surface with the laser light while locating a condenser lens at different positions in the thickness direction, so as to form a plurality of modified spots constituting the modified region at respective distances from the sloped surface.

5. A laser processing method according to claim 2, wherein the modified region forming step irradiates the sloped surface with the laser light while moving a condenser lens along the sloped surface, so as to form a plurality of modified spots constituting the modified region and aligning along the sloped surface at a fixed distance from the sloped surface.

6. A laser processing method according to claim 1, wherein the depression forming step forms the depression by anisotropically etching the object.

7. A laser processing method for forming a hole in a sheet-like object to be processed made of silicon, the method comprising:
- a depression forming step of forming a depression in a part corresponding to the hole on a laser light entrance surface side of the object, the depression opening to the laser light entrance surface;
- a modified region forming step of forming a modified region along a part corresponding to the hole in the object by converging a laser light at the object after the depression forming step; and
- an etching step of anisotropically etching the object after the modified region forming step so as to advance the etching selectively along the modified region and form the hole in the object;

wherein the modified region forming step exposes the modified region or a fracture extending from the modified region to an inner face of the depression, wherein the depression forming step forms a sloped surface tilted with respect to a thickness direction of the object as the inner face of the depression, and wherein the modified region forming step irradiates the sloped surface with the laser light, so as to refract the laser light by the sloped surface and converge the laser light at a part corresponding to the hole in the object.

8. A laser processing method according to claim 7, wherein the hole extends while being tilted by a predetermined angle with respect to the thickness direction, and wherein the depression forming step forms the sloped surface tilted by an angle corresponding to a refractive index of the object for the laser light and the predetermined angle.

9. A laser processing method according to claim 7, wherein the modified region forming step repeatedly performs the step of irradiating the sloped surface with the laser light while locating a condenser lens at different positions in the thickness direction, so as to form a plurality of modified spots constituting the modified region at respective distances from the sloped surface.

10. A laser processing method according to claim 7, wherein the modified region forming step irradiates the sloped surface with the laser light while moving a condenser lens along the sloped surface, so as to form a plurality of modified spots constituting the modified region and aligning along the sloped surface at a fixed distance from the sloped surface.

11. A laser processing method according to claim 7, wherein the depression forming step forms the depression by anisotropically etching the object.

* * * * *